(12) United States Patent
Sharon et al.

(10) Patent No.: US 9,728,263 B2
(45) Date of Patent: Aug. 8, 2017

(54) METHOD AND DEVICE FOR ITERATIVELY UPDATING READ VOLTAGES

(71) Applicant: SANDISK TECHNOLOGIES INC., Plano, TX (US)

(72) Inventors: Eran Sharon, Rishon Lezion (IL); Evgeny Mekhanik, Rehovot (IL); Idan Alrod, Herzliya (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 13/967,145

(22) Filed: Aug. 14, 2013

(65) Prior Publication Data

US 2014/0355340 A1   Dec. 4, 2014

Related U.S. Application Data

(60) Provisional application No. 61/829,646, filed on May 31, 2013.

(51) Int. Cl.
  *G11C 16/26*  (2006.01)
  *G06F 11/10*  (2006.01)
  (Continued)

(52) U.S. Cl.
  CPC .......... *G11C 16/26* (2013.01); *G06F 11/1048* (2013.01); *G11C 11/5642* (2013.01);
  (Continued)

(58) Field of Classification Search
  CPC ...... G06F 11/00; G06F 11/1068; G06F 11/10; G06F 11/004; G11C 16/34; G11C 16/26;
  (Continued)

(56) References Cited

U.S. PATENT DOCUMENTS 7,814,401 B2   10/2010   Alrod et al.
8,099,652 B1   1/2012    Alrod et al.
(Continued)

OTHER PUBLICATIONS

International Search Report and Written Opinion of the International Searching Authority (EPO) for International Application No. PCT/US2014/038831 mailed Aug. 13, 2014, 10 pages.
(Continued)

*Primary Examiner* — Richard Elms
*Assistant Examiner* — Jerome Leboeuf
(74) *Attorney, Agent, or Firm* — Toler Law Group, PC

(57) ABSTRACT

A data storage device includes a memory and a controller. Read voltages are updated based on adjusting a first read voltage without adjusting a second read voltage to generate multiple sets of read voltages, and the multiple sets of read voltages are used to generate multiple representations of data. A value of the first read voltages is selected based on error correction coding (ECC) related information related to the multiple representations of the data. In another embodiment, storage elements of the memory are sensed using a set of candidate read voltages to generate sensing data that is transferred to a memory accessible to the controller. The multiple representations of data may be generated based on the sensing data to emulate results of reading the storage elements using a different combination of candidate reading voltages.

24 Claims, 7 Drawing Sheets

(51) Int. Cl.
*G11C 29/04* (2006.01)
*G11C 11/56* (2006.01)
*G06F 11/14* (2006.01)

(52) U.S. Cl.
CPC ............ *G11C 29/04* (2013.01); *G06F 11/141* (2013.01); *G11C 2029/0411* (2013.01)

(58) Field of Classification Search
CPC ................ G11C 11/5642; G11C 29/04; G11C 2029/0411
USPC .................. 711/102, 103; 714/773, 704, 721
See application file for complete search history.

(56) References Cited

U.S. PATENT DOCUMENTS

| 8,503,237 B1* | 8/2013 | Horn ...................... G11C 29/42 365/185.03 |
| 8,605,502 B1 | 12/2013 | Desireddi et al. |
| 8,782,495 B2 | 7/2014 | Alrod et al. |
| 8,811,076 B2 | 8/2014 | Venkitachalam et al. |
| 8,838,883 B2* | 9/2014 | D'Abreu et al. ............. 711/103 |
| 8,874,992 B2 | 10/2014 | Desireddi et al. |
| 2007/0091677 A1 | 4/2007 | Lasser et al. |
| 2008/0092026 A1 | 4/2008 | Brandman et al. |
| 2008/0263266 A1 | 10/2008 | Sharon et al. |
| 2009/0323422 A1 | 12/2009 | Alrod et al. |
| 2010/0131697 A1 | 5/2010 | Alrod et al. |
| 2010/0192042 A1 | 7/2010 | Sharon et al. |
| 2011/0066902 A1 | 3/2011 | Sharon et al. |
| 2011/0161775 A1 | 6/2011 | Weingarten |
| 2012/0140560 A1 | 6/2012 | Yang |
| 2012/0166913 A1 | 6/2012 | Alrod et al. |
| 2012/0265927 A1* | 10/2012 | Cho et al. ...................... 711/103 |
| 2012/0268994 A1* | 10/2012 | Nagashima ............... 365/185.11 |
| 2013/0055047 A1 | 2/2013 | Sharon et al. |
| 2013/0132652 A1 | 5/2013 | Wood et al. |
| 2013/0275651 A1* | 10/2013 | D'Abreu et al. ............. 711/103 |
| 2013/0290597 A1* | 10/2013 | Faber ........................... 711/102 |
| 2013/0297988 A1* | 11/2013 | Wu ...................... G06F 11/1068 714/773 |
| 2014/0143630 A1* | 5/2014 | Mu ...................... G06F 11/1048 714/763 |
| 2014/0173172 A1 | 6/2014 | Yang et al. |
| 2014/0269052 A1 | 9/2014 | Dusija et al. |
| 2014/0281823 A1* | 9/2014 | Micheloni ........... G06F 11/1012 714/773 |
| 2014/0286102 A1* | 9/2014 | Wu et al. .................. 365/185.21 |
| 2014/0372678 A1* | 12/2014 | Moon et al. ................... 711/103 |
| 2016/0092303 A1 | 3/2016 | Yang |

OTHER PUBLICATIONS

Yang, Nian Niles et al. "Inspection of Non-Volatile Memory for Disturb Effects," U.S. Appl. No. 61/736,983, filed Dec. 13, 2012, 26 pages.

Restriction Requirement mailed Dec. 23, 2015 in U.S. Appl. No. 14/561,084, 7 pages.

International Preliminary Report on Patentability mailed Dec. 10, 2015 in International Application No. PCT/US2014/038831, 8 pages.

Notice of Allowance mailed May 20, 2016 in U.S. Appl. No. 14/561,084, 9 pages.

Non-Final Office Action mailed Oct. 20, 2016 in U.S. Appl. No. 14/561,084, 15 pages.

* cited by examiner

METHOD AND DEVICE FOR ITERATIVELY UPDATING READ VOLTAGES

CROSS-REFERENCE TO RELATED APPLICATIONS

The present application claims priority to U.S. Provisional Application No. 61/829,646, filed May 31, 2013, which application is hereby incorporated by reference in its entirety.

FIELD OF THE DISCLOSURE

The present disclosure is generally related to determining read voltages for a non-volatile memory.

BACKGROUND

Non-volatile data storage devices, such as embedded flash memories, universal serial bus (USB) flash memory devices, or removable storage cards, have allowed for increased portability of data and software applications. Flash memory devices can enhance data storage density by storing multiple bits in each flash memory cell. For example, Multi-Level Cell (MLC) flash memory devices can provide increased storage density by storing 3 bits per cell, 4 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the particular flash memory cell may be programmed to a state (e.g., by setting a threshold voltage) that corresponds to the sequence of bits.

Once memory cells in a data storage device have been programmed, data may be read from the memory cells by sensing the programmed state of each memory cell by comparing the cell threshold voltage to one or more read voltages. However, the sensed programming states can sometimes vary from the written programmed states due to one or more factors, such as data retention and program disturb conditions.

SUMMARY

Accuracy of reading data stored in a data storage device may be improved by updating a set of read voltages used to read the stored data in order to reduce an estimated or actual bit error rate associated with reading the stored data. One or more read voltages may be adjusted while one or more other read voltages are held constant to generate multiple trial sets of read voltages. Multiple representations of the stored data are generated and correspond to reading the stored data using the multiple trial sets. Error correction coding (ECC) related information associated with the multiple representations may be used to select an updated value of the one or more read voltages. Updating of the read voltages may continue by holding the updated value constant while adjusting another read voltage.

DETAILED DESCRIPTION

Figure 1:
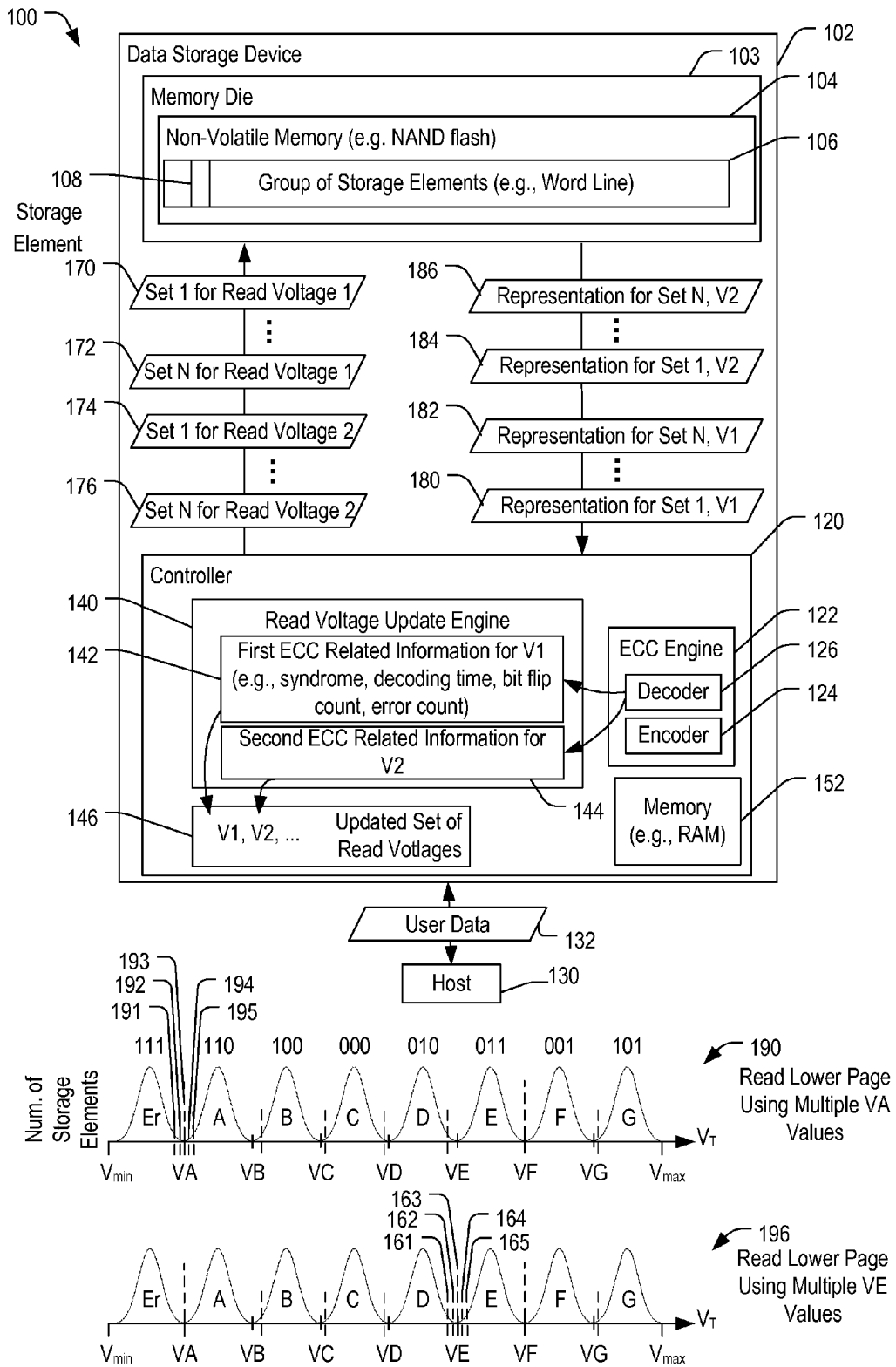
FIG. 1 is a block diagram of a particular illustrative embodiment of a system including a data storage device configured to generate updated read voltages based on ECC related information of multiple representations of data resulting from holding a read voltage constant while adjusting another read voltage.

Referring to FIG. 1, a particular embodiment of a system 100 includes a data storage device 102 coupled to an accessing device such as a host device 130. The data storage device 102 is configured to generate an updated set of read voltages 146 based on ECC related information of multiple representations of data. The multiple representations of data result from adjusting a read voltage while holding another read voltage constant to read the data from a non-volatile memory 104.

The host device 130 may be configured to provide data, such as user data 132, to be stored at the non-volatile memory 104 or to request data to be read from the non-volatile memory 104. For example, the host device 130 may include a mobile telephone, a music player, a video player, a gaming console, an electronic book reader, a personal digital assistant (PDA), a computer, such as a laptop computer, notebook computer, or tablet, any other electronic device, or any combination thereof. The host device 130 communicates via a memory interface that enables reading from the non-volatile memory 104 and writing to the non-volatile memory 104. For example, the host device 130 may operate in compliance with a Joint Electron Devices Engineering Council (JEDEC) industry specification, such as a Universal Flash Storage (UFS) Host Controller Interface specification. As other examples, the host device 130 may operate in compliance with one or more other specifications, such as a Secure Digital (SD) Host Controller specification as an illustrative example. The host device 130 may communicate with the non-volatile memory 104 in accordance with any other suitable communication protocol.

The data storage device 102 includes the non-volatile memory 104 coupled to a controller 120. For example, the non-volatile memory 104 may be a NAND flash memory. The non-volatile memory 104 includes a representative group 106 of storage elements, such as a word line of a multi-level cell (MLC) flash memory. The group 106 includes a representative storage element 108, such as a flash MLC cell. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The controller 120 is configured to receive data and instructions from and to send data to the host device 130. The controller 120 is further configured to send data and commands to the non-volatile memory 104 and to receive data from the non-volatile memory 104. For example, the controller 120 is configured to send data and a write command to instruct the non-volatile memory 104 to store the data to a specified address. As another example, the controller 120 is configured to send a read command to the non-volatile memory 104.

The controller 120 includes an ECC engine 122 that is configured to receive data to be stored to the memory 104 and to generate a codeword. For example, the ECC engine 122 may include an encoder 124 configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 122 may include a decoder 126 configured to decode data read from the memory 104 to detect and correct, up to an error correction capability of the ECC scheme, any bit errors that may be present in the data.

The controller 120 includes a read voltage update engine 140 that is configured to generate the updated set of read voltages 146 based on ECC related information received from the decoder 126. To illustrate, a first graph 190 shows a histogram or distribution of storage element threshold values having clusters representing states Erase (Er), A, B, C, D, E, F, and G, in a 3-bit per cell (3BPC) multi-level cell (MLC) implementation. A set of read voltages VA, VB, VC, VD, VE, VF, and VG define boundaries between the states and may be used to determine a state of a storage element. For example, applying the read voltage VA to a word line of the group 106 activates storage elements having threshold voltages less than VA while storage elements having threshold voltages greater than VA are not activated.

Some storage elements originally set to the Er state may experience a threshold voltage shift that causes the threshold voltages of the storage elements to be greater than VA. Reading these storage elements using VA results in bit errors because the storage elements are read as having a "110" value (corresponding to state A) rather than having a "111" value (corresponding to the Er state). Similarly, some storage elements originally programmed to state A may experience a threshold voltage shift that causes the threshold voltages of the storage elements to be less than VA. Reading these storage elements using VA also results in bit errors because the storage elements are read as having a "111" value rather than having a "110" value.

The read voltage update engine 140 may be configured to adjust VA, such as by sequentially assigning VA to a first trial value 191, a second trial value 192, a third trial value 193, a fourth trial value 194, and a fifth trial value 195, without adjusting the other read voltages VB-VG. Each resulting set of read voltages may be used to read the data from the group 106, and the resulting data may be decoded by the decoder 126. ECC related information from the decoder 126 may be used to select one of the trial values 191-195 that results in a lowest estimated or actual number of bit errors in the data (as compared to the estimated or actual number of bit errors corresponding to the other trial values 191-195). Another example may include an SLC memory with only two states (Er and A), and the adjusting of VA in this case may be performed by sequentially assigning VA to a first trial value 191, a second trial value 192, a third trial value 193, a fourth trial value 194, and a fifth trial value 195. Each resulting set of read voltages may be used to read the data from the group 106, and the resulting data may be decoded by the decoder 126. ECC related information from the decoder 126 may be used to select one of the trial values 191-195 that results in a lowest estimated or actual number of bit errors in the data (as compared to the estimated or actual number of bit errors corresponding to the other trial values 191-195). More generally, the ECC related information may be used to select one of the trial values that results in a minimal (or maximal) detected value of an ECC related metric corresponding to the ECC related information. For example, an objective may be to determine a read threshold which minimizes the bit error rate. As another example, an objective may be to minimize ECC power, latency, throughput, or any other ECC related metric. Also it is not necessary to decode the codewords for determining an "optimal" read voltage. Other ECC related information may be used without fully decoding (e.g. computing the number of unsatisfied ECC parity-check equations, also known as syndrome weight, without full decoding, or BER estimation without decoding, as non-limiting examples).

After selecting one of the trial values for VA, the read voltage update engine 140 may select another read voltage to adjust. A second graph 196 illustrates multiple trial values of VE that may each be used to read the data from the group 106. The resulting data may be decoded at the decoder 126 and a trial value selected for VE based on comparisons of actual or estimated errors. Each read voltage of the updated set of read voltages 146 may be updated by the read voltage update engine 140 in a similar manner as described with respect to VA.

During operation, a determination may be made to perform a read voltage update. The determination to perform a read voltage update may be based on a total number of write/erase (W/E) cycles at the non-volatile memory 104 exceeding a W/E threshold, the time that elapsed since the block including the group of storage elements 106 has been programmed (or any other indication or metric that is correlated to the time) exceeding a threshold, a number of read operations in a block that includes the group 106 exceeding a read threshold, or an average number of errors detected by the decoder 126 exceeding an error threshold, as illustrative, non-limiting examples.

The read voltage update engine 140 may select one or more read voltages for adjustment in a first iteration of a read voltage update process. The group 106 may store data in a page-by-page, non-interleaved manner, such that a first ECC codeword is stored in a first logical page of a physical page of the group 106 (e.g., a 'lower' page corresponding to the least significant bit stored in each storage element of the physical page). A second ECC codeword may be stored in a second logical page of the physical page (e.g., a 'middle' page corresponding to the middle bit stored in each storage element of the physical page). A third ECC codeword may be stored in a third logical page of the physical page (e.g., an 'upper' page corresponding to the most significant bit stored in each storage element of the physical page).

As illustrated in the first graph 190, VA may be selected as a first read voltage to be adjusted. As illustrated in the second graph 196, VE may be selected as a second read voltage to be adjusted. Because the lower page bit value stored in a storage element is "1" for storage elements in state Er and in states E, F, and G and is "0" for storage elements in states A, B, C and D, the lower page can be read by performing sense operations at the Er-A boundary (VA) and at the D-E boundary (VE).

The read voltage update engine 140 may select the first trial value 191 and may generate a first set of read voltages 170 for determining the first read voltage (VA). The first set of read voltages 170 may be represented as the set {first trial value 191, VE}. A first representation 180 of data may be read from the group 106 using the first set of read voltages 170 and received at the controller 120. The first representation 180 may be provided to the decoder 126.

The read voltage update engine 140 may select the second trial value 192 and generate a second set of read voltages for determining the first read voltage (VA). The second set of read voltages may be represented as {second trial value 192, VE}. The read voltage update engine 140 may also generate a third set of read voltages {third trial value 193, VE}, a fourth set of read voltages {fourth trial value 194, VE}, up to an Nth set of read voltages 172 of {fifth trial value 195, VE} (e.g., N=5) for determining the first read voltage. Each generated set of read voltages 170-172 may be sent to the non-volatile memory 104 and used to read a corresponding representation 180-182 that is provided to the decoder 126.

The decoder 126 may generate first ECC related information 142 responsive to the multiple representations 180-182. The ECC related information may also be generated by a separate designated ECC related function (e.g., a separate hardware engine) and not necessarily by the ECC decoder 106. The read voltage update engine 140 may receive or otherwise access the first ECC related information 142 to determine or estimate a number of errors or a bit error rate (BER) for each of the representations 180-182. Alternatively, or in addition, the read voltage update engine 140 may determine any other ECC related metric.

To illustrate, when the decoder 126 fully decodes each of the representations 180-182, the decoder 126 may generate information including a number of corrected errors. The read voltage update engine 140 may compare the number of corrected errors resulting from reading the data with each of the sets 170-172 to select the particular set 170-172 having the lowest identified number of corrected errors of the sets 170-172. The trial value of VA for the selected set (e.g., the third trial value 193) may be used as an updated value of VA.

In other implementations, latency associated with fully decoding each of the representations 180-182 may be avoided by estimating a bit error rate (BER) or number of errors without fully decoding the representations 180-182. For example, the decoder 126 may generate a syndrome value indicating a number of parity check equations that are unsatisfied for each of the representations 180-182. The syndrome for each of the representations 180-182 generally indicates a relative amount of errors in each of the corresponding representations 180-182. The syndrome may be generated using dedicated hardware circuitry with reduced latency as compared to full decoding. The first ECC related information 142 may include syndrome values for each of the representations 180-182 and the read voltage update engine 140 may search and/or sort the syndromes to identify a lowest estimated BER of the representations 180-182 and to select a corresponding trial value of VA.

As another example, a length of time corresponding to a decoding operation may be used to estimate a number of errors or BER. To illustrate, representations of data having a greater number of errors may generally require longer decoding (e.g., more iterations for convergence, longer error location search processing, etc.) than representations of data having fewer errors. The decoder 126 may be configured to fully decode a first representation of data and to store the decoding time for the first representation. For each subsequent representation of data, the decoder 126 may terminate decoding if the decoding time exceeds the stored decoding time, or may update the stored decoding time if the decoding time is less than the stored decoding time. The first ECC related information 142 may indicate one or more decoding times or relative decoding times of the representations 180-182 to enable the read voltage update engine 140 to identify a shortest of the decoding times of the representations 180-182 and to select a corresponding trial value of VA.

As another example, a number of bit values that change during a decoding operation may be used to estimate a number of errors or BER. To illustrate, during an iterative decoding process, representations of data having a greater number of errors may experience more "bit flips" prior to convergence than representations of data having a lesser number of errors. The decoder 126 may be configured to track a number of bit flips for each representation 180-182 and to indicate resulting counts of bit flips in the first ECC related information 142 to enable the read voltage update engine 140 to identify a lowest count of bit flips of the representations 180-182 and to select a corresponding trial value of VA.

As another example, at least a portion of the data stored in the group 106 may be reference data. The portion of each of the representations 180-182 that corresponds to the reference data may be compared to the reference data to identify errors. For example, the decoder 126 may include circuitry configured to compare a portion of each representation 180-182 to the reference data and to generate a count of detected bit errors. The resulting counts may be provided in the first ECC related information 142 to enable the read voltage update engine 140 to identify a lowest of the counts of reference data errors of the representations 180-182 and to select a corresponding trial value of VA.

After selection of a trial value of VA (e.g., the third trial value 193), the read voltage update engine 140 may select a first trial value 161 of VE, as illustrated in the second graph 196, and may generate a first set of read voltages 174 for determining the second read voltage (VE). The first set of read voltages 174 may be represented as the set {third trial value 193, first trial value 161 of VE}. A first representation 184 of data may be read from the group 106 using the first set of read voltages 174 and received at the controller 120. The first representation 184 may be provided to the decoder 126.

The read voltage update engine 140 may select a second trial value 162 of VE and generate a second set of read voltages for determining VE. The second set of read voltages may be represented as {third trial value 193, second trial value 162 of VE}. The read voltage update engine 140 may also generate a third set of read voltages {third trial value 193, third trial value 163 of VE}, a fourth set of read voltages {third trial value 193, fourth trial value 164 of VE}, up to an Nth set of read voltages 176 of {third trial value 193, fifth trial value 165 of VE} (e.g., N=5) for determining VE. Each generated set of read voltages 174-176 may be sent to the non-volatile memory 104 and used to read a corresponding representation 184-186 that is provided to the decoder 126.

The decoder 126 (or a separate designated ECC related function) may generate second ECC related information 144 for each of the representations 184-186 that is provided to or accessible to the read voltage update engine 140. As described with respect to the first ECC related information 142, the second ECC related information 144 may include one or more counts of corrected errors, syndrome values, indications of decoding times, counts of changed bit values, or indications of similarity to reference data, as illustrative, non-limiting examples. The second ECC related information 144 enables the read voltage update engine 140 to select a trial value of VE (e.g., the third trial value 163 of VE) that reduces an actual or estimated number of errors or BER.

The read voltage update engine 140 may update the values of VA and VE in the updated set of read voltages 146 after selecting trial versions of VA and VE as described above. However, in other implementations, the read voltage update engine 140 may repeat the VA, VE selection process by selecting a next value of VA using trial values of VA with the selected value of VE and selecting a next value of VE using the most recently selected value of VA with trial values of VE. The process may be repeated iteratively until a convergence criterion is achieved. For example, the convergence criterion may be achieved when an estimated BER does not decrease between successive iterations of the VA, VE selection process.

The other read voltages may be updated in a manner similar to VA and VE. For example, the upper page may be read using VC and VG. The group 106 may be read using trial values of VC while holding VG constant, followed by adjusting VG while holding VC constant. As another example, the middle page may be read using VB, VD, and VF. The group 106 may be read using trial values of VB while holding VD and VF constant, followed by adjusting VD while holding VB and VF constant, followed by adjusting VF while holding VB and VD constant.

By adjusting a selected read voltage while holding other read voltages constant, changes in error counts or BERs (actual or estimated) or any other ECC related metric (such as latency, throughput, power, etc.) resulting from changes in the selected read voltage may be identified and an "optimal" value of each of the read voltages associated with the fewest errors (or lowest decoding latency, or lowest decoding power, etc.) may be selected.

Although the non-volatile memory 104 is described as a three bits per storage element (3BPC) MLC, in other implementations the non-volatile memory 104 may store a single bit per storage element (SLC), two bits per storage element (2BPC), four bits per storage element (4BPC), or any other number of bits per storage element. Although in the examples described above, five trial values of each read voltage are illustrated (e.g., N=5), in other implementations a number of trial values may be less than five or more than five.

Although the group 106 is described as storing multiple codewords in a page-by-page, non-interleaved manner, in other implementations one or more ECC codewords may be interleaved across multiple logical pages. Reading multiple (or all) of the logical pages of a physical page may include performing sense operations using all of the read voltages VA-VG, rather than using a reduced set corresponding to a single logical page, to read a single codeword from the group 106. Each read voltage may be individually varied and a trial value selected based on ECC related information for the single ECC codeword.

In other implementations, a number of sensing operations may be reduced and an amount of time to complete selection of read voltages may be reduced by storing data at the controller 120 (e.g., in a memory 152, such as a random access memory (RAM) in the controller 120 or a memory accessible to the controller 120) that corresponds to data read from the non-volatile memory 104 that corresponds to a particular read voltage.

For example, as illustrated in the first graph 190, reading the lower page includes sensing at VA and VE. Conventionally, reading the lower page of the group 106 may include first sensing the group 106 using VA and storing the first sensing results in a latch at the non-volatile memory 104. Next, the group 106 may be sensed using VE and second sensing results may be stored in another latch at the non-volatile memory 104. The first sensing results (e.g., "D1") and the second sensing results (e.g., "D2") may be combined using a bit-wise logical operation, such as NOT (D1 XOR D2), where NOT indicates a logical inverse operation and XOR indicates an exclusive-OR operation.

However, when adjusting VA while VE is held constant, the second sensing results (D2) do not change. These results may be stored in the latch at the non-volatile memory 104 or at the memory 152 and combined with the first sensing results for each trial value of VA, reducing a total number of sensing operations that are performed.

Table 1 illustrates, for each of the states Er-G, a first row of values that result from sensing using VA (e.g., D1), a second row of values that result from sensing using VE (e.g., D2), and a third row of results of a NOT-XOR operation of the first row and the second row that corresponds to a lower page reading. The values in the third row are logically equivalent to the results attained by reading the lower page of the group 106.

TABLE 1

|  | Er | A | B | C | D | E | F | G |
|---|---|---|---|---|---|---|---|---|
| Sense at VA = Sense between Er-A | 1 | 0 | 0 | 0 | 0 | 0 | 0 | 0 |
| Sense at VE = Sense between D-E | 1 | 1 | 1 | 1 | 1 | 0 | 0 | 0 |
| NOT-XOR the two reads = Lower Page read | 1 | 0 | 0 | 0 | 0 | 1 | 1 | 1 |

An implementation of updating read voltages may include reading at VE once (to generate the first row of Table 1) and storing results of the reading (e.g. at a latch of the non-volatile memory, or at a memory of the controller (e.g. RAM 152). An additional reading of the group 106 may be performed using VA only (i.e., without sensing using VE) to generate the second row of Table 1. A NOT-XOR operation may be performed to generate data corresponding to the third row of Table 1 for each storage element in the group 106. The results of the NOT-XOR corresponding to lower page reads at multiple VA values and at a fixed VE value may be stored in a latch in the non-volatile memory 104 or in the memory 152, as illustrative examples.

The group 106 may be sensed using various trial values of VA (e.g., the trial values 191-195) and a NOT-XOR operation of each sensing result and the stored data may be performed to generate a lower page read result for each trial value of VA. As a result, each of the representations 180-182 may be generated without repeating the VE sense operation for each of the representations 180-182. The representations 180-182 may be provided to the decoder 126 to generate the first ECC related information 142 to be processed by the read voltage update engine 140.

In some implementations, selection of read voltages may be performed using a "coarse" phase using a first voltage difference between trial values (e.g., a first step size) to select a "coarse" value for one or more read voltages. The coarse phase may be followed by a "fine" phase using a second voltage difference between trial values (e.g., a second step size smaller than the first step size). The fine phase may include performing a scan of trial values around the coarse value that is selected during the coarse phase.

In some implementations, selection of read voltages may be performed using another two-phase process, where an initial set of read thresholds are determined during the first phase. For example, the initial set of read thresholds may be determined by finding local minima of a cell voltage distribution (CVD). To illustrate, lowest points between each of the nodes of the first graph 190 may be determined to select an initial set of read voltages. A second phase following the first phase may include generating multiple trial sets of read voltages and selecting a trial value of a particular read voltage based on ECC related information, such as described with respect to the read voltage update engine 140.

Figure 2:
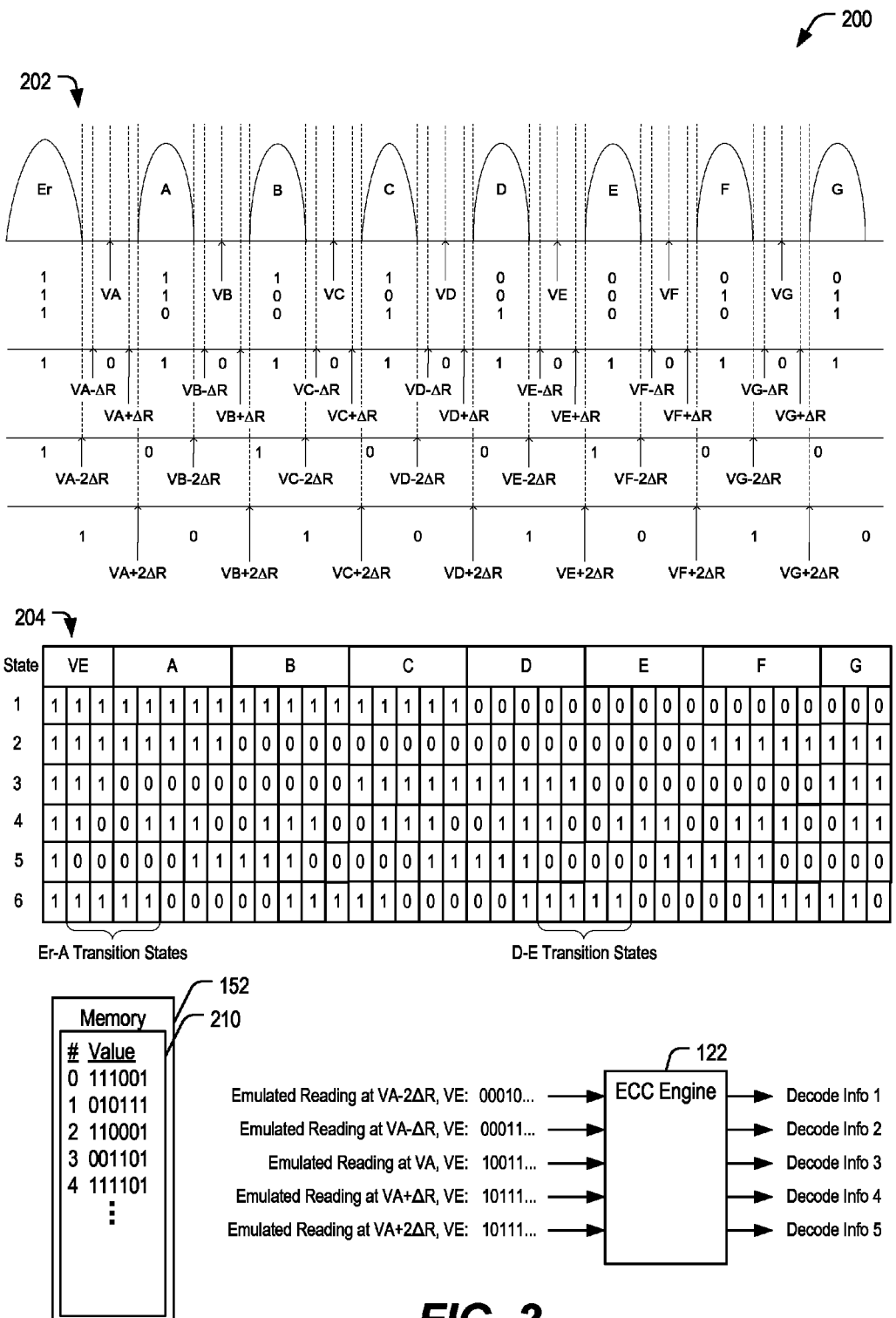
FIG. 2 is a diagram of a particular embodiment of components of the data storage device of FIG. 1 configured to store storage element state data in a controller memory and to use the stored state data to emulate performing read operations.

FIG. 2 illustrates another embodiment of updating read voltages that may be performed by the data storage device 102 of FIG. 1 and includes a graphical depiction 202 of cell distributions for states (Er, A, . . . G), read voltages (e.g., voltages VA, VB, . . . VG), and candidate read voltages (e.g., trial values) for read voltages (e.g., voltages VA−2ΔR, VA−ΔR, VA, VA+ΔR, VA+2ΔR). To illustrate, the first trial value 191 of FIG. 1 may correspond to the candidate voltage VA−2ΔR, the second trial value 192 may correspond to the candidate voltage VA−ΔR, and the third trial value 193 may correspond to the candidate voltage VA, etc. A first table 204 illustrates a mapping of each voltage interval between adjacent trial read voltages to a set of six bits.

A read voltage update process may include reading a group of storage elements (e.g., the group 106 of FIG. 1) one time using each of the multiple (e.g., 35) trial read values (e.g., five trial values for each of seven read voltages). A result of the sensing may be encoded as illustrated in the first table 204 and stored in the memory 152 of FIG. 1 as a table 210 including a 6-bit value for each storage element that is sensed (e.g., to occupy six pages of RAM). To illustrate, the entry in the table 210 for the storage element having index 0 has a value "111001", corresponding to a threshold voltage in the voltage range between VA−ΔR and VA. The 6-bit value may be used to emulate a result of sensing the storage element at any of the 35 candidate voltages. For example, the storage element with index 0 has a "1" value for candidate voltages that are less than or equal to VA−ΔR and has a "0" value for candidate voltages that are greater than or equal to VA.

Rather than reading the non-volatile memory 104 of FIG. 1 with multiple sets of read voltages, such as the sets 170-172, the read voltage update engine 140 may access the table 210 to generate multiple representations of data that emulate results of reading storage elements using different combinations of candidate reading voltages. The representations of data may be selected and provided to the ECC engine 122 to produce ECC related information, and the ECC related information may be evaluated to select candidate voltages corresponding to lowered actual or estimated errors or BER, as described with respect to FIG. 1.

To illustrate, if the 6 bit read value (corresponding to the table 210) of a storage element having index 0 is 111001, then an emulated reading using a first set of read voltages {VA−2ΔR, VE} or a second set of read voltages {VA−ΔR, VE} results in a representation of stored data having a first bit sequence beginning with '0' that may be provided to the ECC engine 122 to generate first ECC related information. An emulated reading of the same storage element using a third set of read voltages {VA, VE} results in a second bit sequence beginning with '1' that may be provided to the ECC engine 122 to generate second ECC related information. The fifth storage element (having index 4) has a changed value as compared to the first bit sequence because the 6-bit value "111101" in the table 210 indicates that a threshold voltage for the fifth storage element is between VA−2ΔR and VA−ΔR. Therefore an emulated reading of this storage element using the first set of read voltages {VA−2ΔR, VE} results in a third bit sequence beginning with '0', but reading with the second set of read voltages {VA−ΔR, VE} results in a third bit sequence beginning with '1' that may be provided to the ECC engine 122.

By storing the sensing information in the memory 152 (e.g., in the table 210), a number of sensing operations may be reduced as compared to embodiments that perform sensing of storage elements for every trial set of read voltages. An amount of data transferred from the non-volatile memory 104 to the controller 120 may also be reduced as compared to embodiments where multiple representations of data are read from the non-volatile memory 104 for every read voltage. Estimating an error count or BER may be performed digitally in the controller 120 at relatively high speed and low power as compared to sensing operations and data transfer at the non-volatile memory 104. The controller 120 may include dedicated hardware circuitry to perform a portion or all of the read voltage update process as described with respect to FIG. 2.

To summarize, in an embodiment, a three step procedure may be performed. A first step may involve reading the group of storage elements 106 (requiring a minimal number of sensing operations) and transferring the read results to the controller memory 152 (requiring a minimal number of page transfers). In a second step dedicated hardware circuitry may read the internal controller memory 152 to generate (e.g., sequentially) for each of the multiple candidate read thresholds an emulated read result on which it will compute the ECC related information or metric. The second step may be performed solely within the controller, at high speed as compared to performing multiple read operations to generate the read results. In a third step, the best candidate read thresholds may be selected based on the ECC related information or metrics generated during the second step, such as selected as to minimize (or maximize) the ECC related metric.

Figure 3:
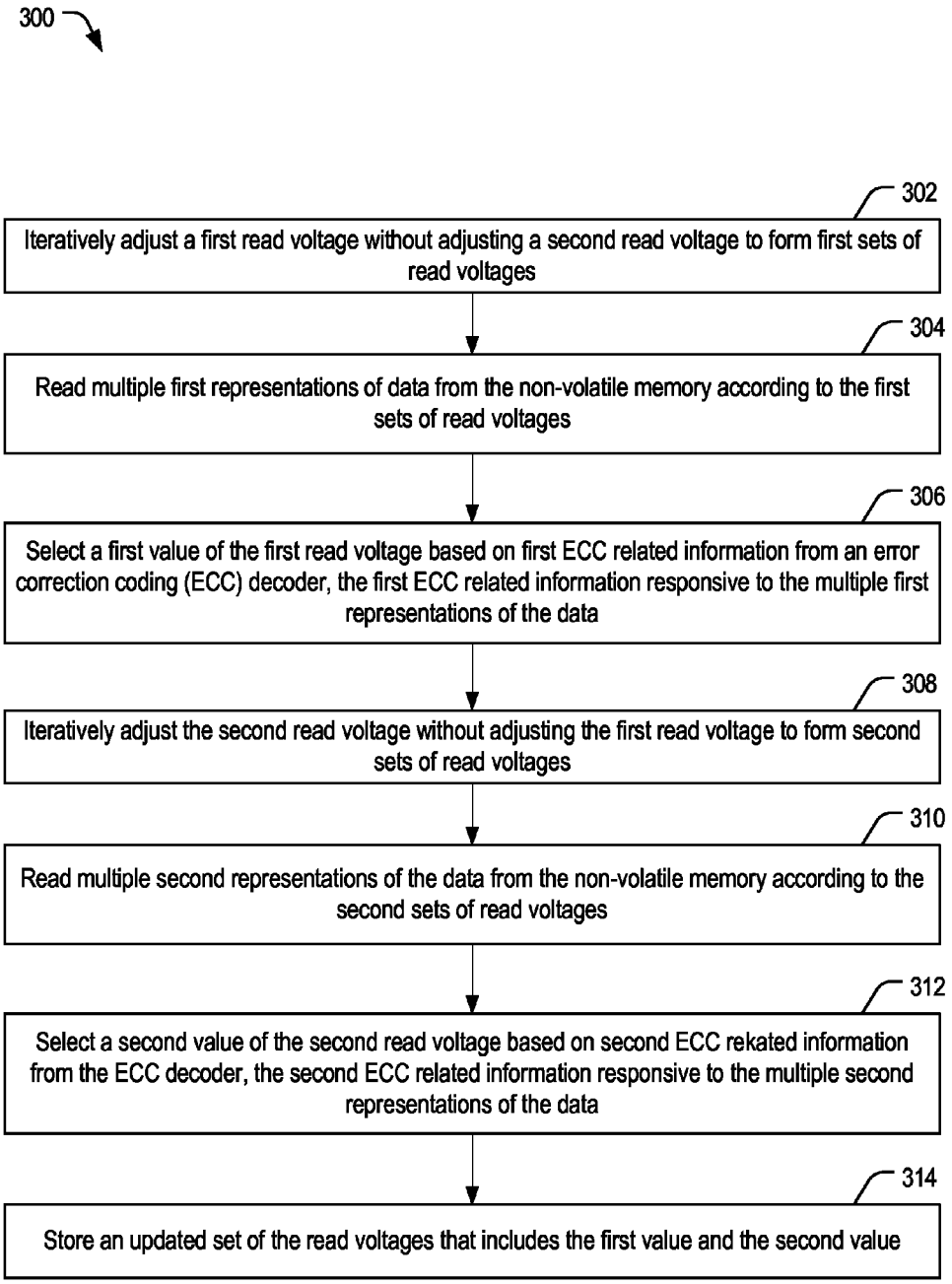
FIG. 3 is a flow chart of a particular embodiment of a method of updating read voltages that may be performed by the data storage device of FIG. 1.

FIG. 3 depicts an embodiment of a method 300 of updating a set of read voltages. The method 300 may be performed in a data storage device including a controller and a non-volatile memory, such as the data storage device 102 of FIG. 1.

The method 300 includes iteratively adjusting a first read voltage without adjusting a second read voltage to form first sets of read voltages, at 302. For example, the read voltage update engine 140 may adjust the read voltage VA to have the multiple trial values 191-195 to form the sets 170-172 of read voltages. As another example, iteratively adjusting the first read voltage may include generating first values of the first read voltage according to a first step size and, after identifying one of the first values based on a portion of the first ECC related information corresponding to the first values, generating a second set of values of the first read voltage according to a second step size that is smaller than the first step size.

Multiple first representations of data are read from the non-volatile memory according to the first sets of read voltages, at 304. For example, the multiple first representations of the data may include the representations 180-182 corresponding to the sets 170-172 of read voltages of FIG. 1. To illustrate, the first representation 180 may correspond to reading the group 106 using the first set 170, and the Nth representation 182 may correspond to reading the group 106 using the Nth set 172 of read voltages.

A first value of the first read voltage is selected based on first ECC related information from an error correction coding (ECC) decoder, at 306. The first ECC related information is responsive to the multiple first representations of the data. For example, the first ECC related information may correspond to the first ECC related information 142 of FIG. 1. As an example, the first ECC related information may correspond to a count of errors detected by the ECC decoder. As another example, the first ECC related information may correspond to a syndrome value (that may be generated by an ECC decoder or may be generated by other components (e.g., dedicated circuitry) other than an ECC decoder). As another example, the first ECC related information may correspond to a length of time of a decoding operation. As another example, the first ECC related information may correspond to a count of bit values that change during a decoding operation. As another example, the first ECC related information may correspond to a similarity of reference data to each of the multiple first representations of the data (e.g., based on counts of differences, or bit errors, between the first representations and the reference data).

The second read voltage is iteratively adjusted without adjusting the first read voltage to form second sets of read voltages, at 308. For example, the read voltage update engine 140 may adjust the read voltage VE to have the multiple trial values illustrated in the second graph 192 of FIG. 1 to form the sets 174-176 of read voltages.

Multiple second representations of the data from the non-volatile memory are read according to the second sets of read voltages, at 310. For example, the multiple second representations of the data may include the representations 184-186 corresponding to the sets 174-176 of read voltages of FIG. 1. To illustrate, the first representation 184 may correspond to reading the group 106 using the first set 174, and the Nth representation 186 may correspond to reading the group 106 using the Nth set 176 of read voltages.

A second value of the second read voltage is selected based on second ECC related information from the ECC decoder, at 312. The second ECC related information responsive to the multiple second representations of the data. For example, the second ECC related information may correspond to the second ECC related information 144 of FIG. 1.

An updated set of the read voltages that includes the first value and the second value is stored, at 314. For example, the updated set of the read voltages may correspond to the updated set 146 of FIG. 1.

The method 300 may further include determining whether a convergence condition has been satisfied by comparing the first ECC related information to the second ECC related information. For example, the convergence criterion may correspond to determining whether a count of errors or BER (actual or estimated) decreased for the second read voltage as compared to the count of errors or BER for the first read voltage. The convergence criterion may be satisfied when no reduction in errors or BER occurs as a result of updating a read voltage, and updating of the read voltages may end. In response to determining that the convergence condition has not been satisfied, a second updated set of the read voltages may be based on third ECC related information resulting from representations of the data according to third sets of the read voltages with varying values of the first read voltage. For example, when the convergence criterion has not been satisfied (e.g., the count of errors or BER after selecting the second value of the second read voltage at 312 is less than the count of errors or BER after selecting the first value of the first read voltage at 308), processing may return to 302 where a next sets of read voltages are generated.

Figure 4:
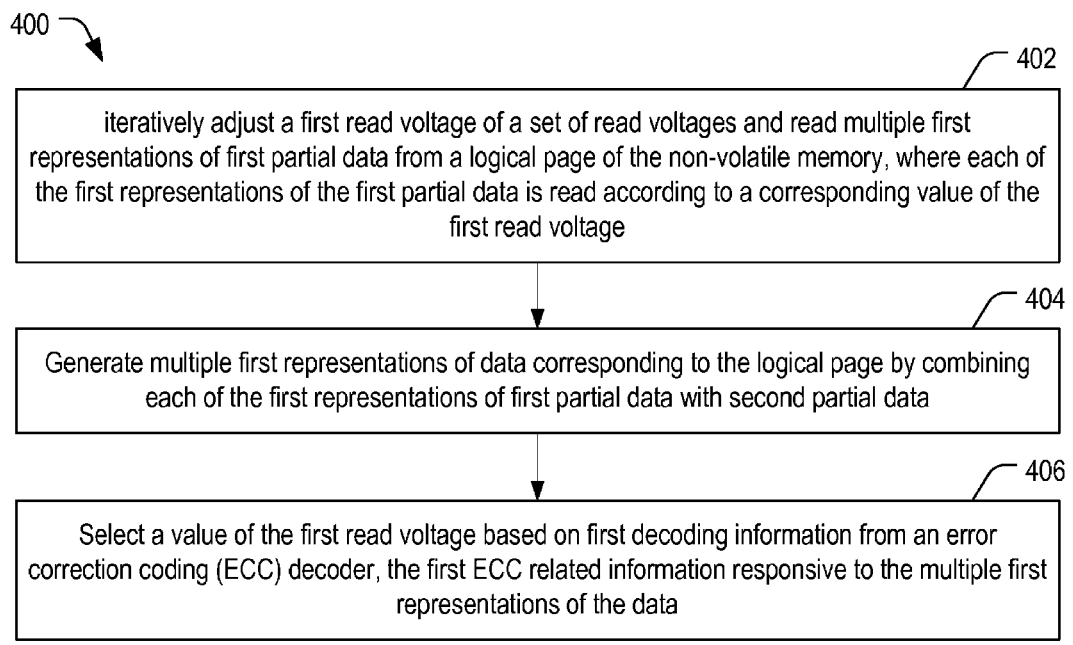
FIG. 4 is a flow chart of another particular embodiment of a method of updating read voltages that may be performed by the data storage device of FIG. 1.

FIG. 4 depicts an embodiment of a method 400 of updating a set of read voltages. The method 400 may be performed in a data storage device including a controller and a non-volatile memory, such as the data storage device 102 of FIG. 1.

The method 400 includes iteratively adjusting a first read voltage of a set of read voltages and reading multiple first representations of first partial data from a logical page of the non-volatile memory, at 402. Each of the first representations of the first partial data is read according to a corresponding value of the first read voltage. For example, the first representations may correspond to sensing the group 106 using different trial values 191-195 of the read voltage VA without also sensing the group 106 using the read voltage VE.

Multiple first representations of data corresponding to the logical page are generated by combining each of the first representations of first partial data with second partial data, at 404. For example, data corresponding to sending the group 106 may be stored and combined with each of the first representations, such as via a NOT-XOR operation as described with respect to Table 1.

A value of the first read voltage is selected based on first ECC related information, at 406. The first ECC related information is responsive to the multiple first representations of the data. For example, the first ECC related information may correspond to the first ECC related information 142 of FIG. 1.

After determining the second partial data, generating the multiple representations may be performed using fewer sense operations as compared to the method 300 of FIG. 3. For example, a first representation of the data may be from the logical page of the non-volatile memory using a first value of the first read voltage and a second read voltage (e.g., using VA and VE). A second representation of the partial data may be read from the first logical page using the first value of the first read voltage without using the second read voltage (e.g., sensing only using VA and not using VE). The second partial data of the logical page may be generated by applying a logical operation to the first representation and to the first partial data, such as the NOT-XOR operation described with respect to Table 1. A reduced number of sensing operations may reduce a time to complete updating the read voltages.

Figure 5:
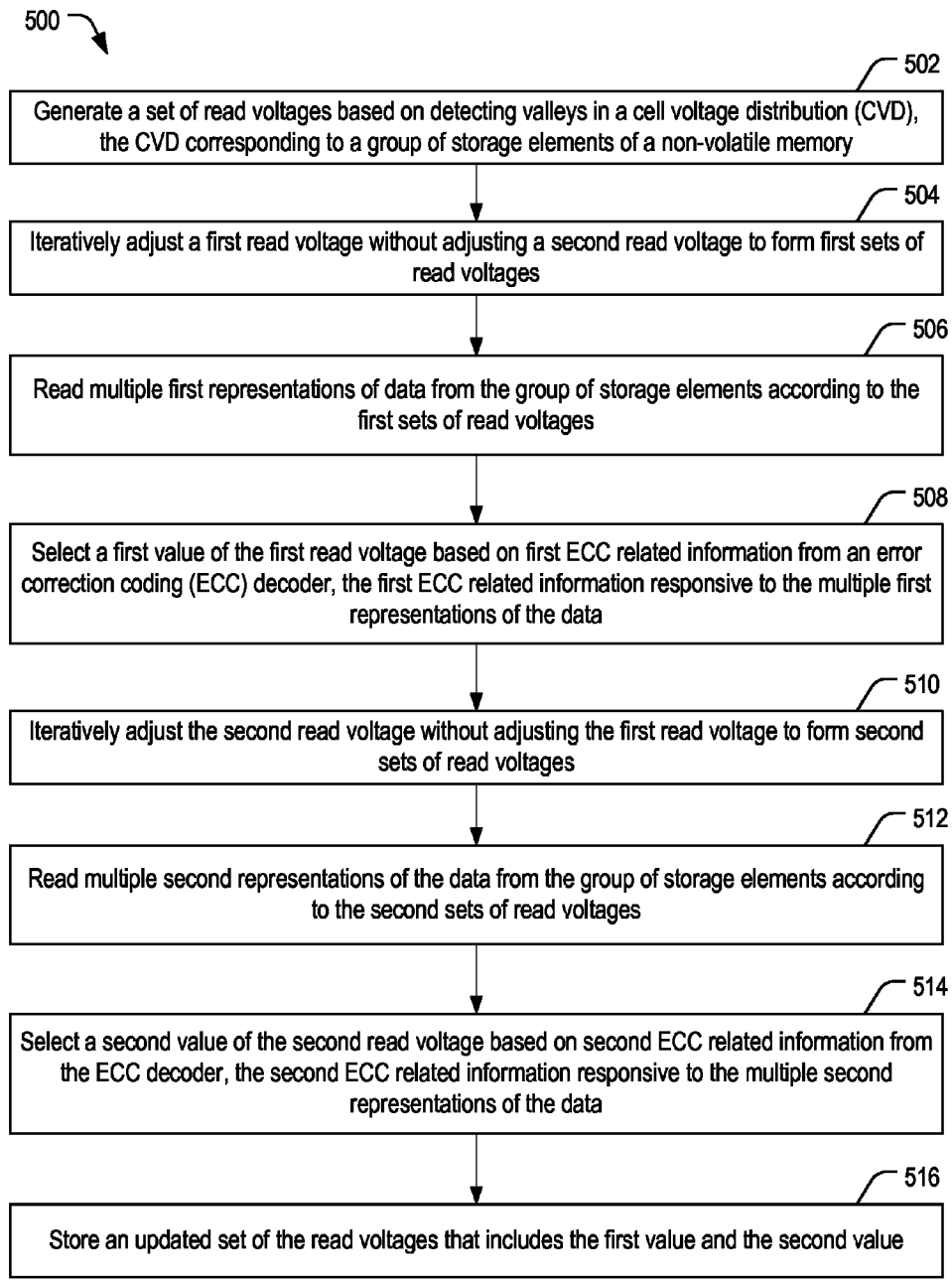
FIG. 5 is a flow chart of another particular embodiment of a method of updating read voltages that may be performed by the data storage device of FIG. 1.

FIG. 5 depicts an embodiment of a method 500 of updating a set of read voltages. The method 500 may be performed in a data storage device including a controller and a non-volatile memory, such as the data storage device 102 of FIG. 1.

The method 500 includes generating a set of read voltages based on detecting valleys in a cell voltage distribution (CVD), at 502. The CVD corresponds to a group of storage elements of the non-volatile memory. For example, the valleys may correspond to local minima in the first graph 190 of FIG. 1.

A first read voltage of the set of read voltages is iteratively adjusted without adjusting a second read voltage of the set of read voltages to form first sets of read voltages, at 504. For example, the read voltage update engine 140 may adjust the read voltage VA to have the multiple trial values 191-195 to form the sets 170-172 of read voltages. As another example, iteratively adjusting the first read voltage may include generating first values of the first read voltage according to a first step size and, after identifying one of the first values based on a portion of the first ECC related information corresponding to the first values, generating a second set of values of the first read voltage according to a second step size that is smaller than the first step size.

Multiple first representations of data are read from the group of storage elements according to the first sets of read voltages, at 506. For example, the multiple first representations of the data may include the representations 180-182 corresponding to the sets 170-172 of read voltages of FIG. 1. To illustrate, the first representation 180 may correspond to reading the group 106 using the first set 170, and the Nth representation 182 may correspond to reading the group 106 using the Nth set 172 of read voltages.

A first value of the first read voltage is selected based on first ECC related information from an error correction coding (ECC) decoder, at 508. The first ECC related information is responsive to the multiple first representations of the data. For example, the first ECC related information may correspond to the first ECC related information 142 of FIG. 1. As an example, the first ECC related information may correspond to a count of errors detected by the ECC decoder. As another example, the first ECC related information may correspond to a syndrome value. As another example, the first ECC related information may correspond to a length of time of a decoding operation. As another example, the first ECC related information may correspond to a count of bit values that change during a decoding operation. As another example, the first ECC related information may correspond to a similarity of reference data to each of the multiple first representations of the data (e.g., based on counts of differences, or bit errors, between the first representations and the reference data).

The second read voltage is iteratively adjusted without adjusting the first read voltage to form second sets of read voltages, at 510. For example, the read voltage update engine 140 may adjust the read voltage VE to have the multiple trial values illustrated in the second graph 192 of FIG. 1 to form the sets 174-176 of read voltages.

Multiple second representations of the data are read from the group of storage elements according to the second sets of read voltages, at 512. For example, the multiple second representations of the data may include the representations 184-186 corresponding to the sets 174-176 of read voltages of FIG. 1. To illustrate, the first representation 184 may correspond to reading the group 106 using the first set 174, and the Nth representation 186 may correspond to reading the group 106 using the Nth set 176 of read voltages.

A second value of the second read voltage is selected based on second ECC related information from the ECC decoder, at 514. The second ECC related information is responsive to the multiple second representations of the data. For example, the second ECC related information may correspond to the second ECC related information 144 of FIG. 1.

An updated set of the read voltages that includes the first value and the second value is stored, at 516. For example, the updated set of the read voltages may correspond to the updated set 146 of FIG. 1.

The method 500 may further include determining whether a convergence condition has been satisfied by comparing the first ECC related information to the second ECC related information. For example, the convergence criterion may correspond to determining whether a count of errors or BER (actual or estimated) decreased for the second read voltage as compared to the count of errors or BER for the first read voltage. The convergence criterion may be satisfied when no reduction in errors or BER occurs as a result of updating a read voltage, and updating of the read voltages may end. In response to determining that the convergence condition has not been satisfied, a second updated set of the read voltages may be based on third ECC related information resulting from representations of the data according to third sets of the read voltages with varying values of the first read voltage. For example, when the convergence criterion has not been satisfied (e.g., the count of errors or BER after selecting the second value of the second read voltage at 312 is less than the count of errors or BER after selecting the first value of the first read voltage at 308), processing may return to 302 where a next sets of read voltages are generated.

Figure 6:
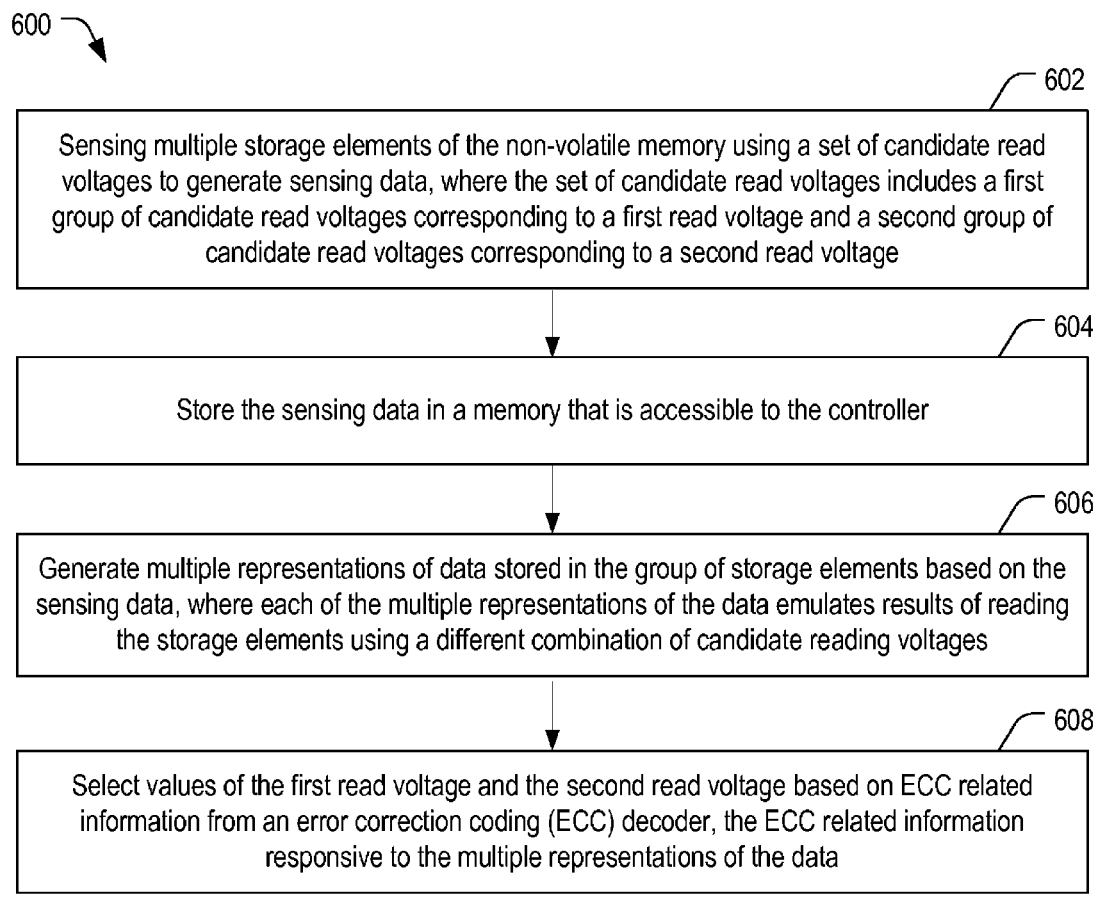
FIG. 6 is a flow chart of another particular embodiment of a method of updating read voltages that may be performed by the data storage device of FIG. 1.

FIG. 6 depicts an embodiment of a method 600 of updating a set of read voltages. The method 600 may be performed in a data storage device including a controller and a non-volatile memory, such as the data storage device 102 of FIG. 1.

Multiple storage elements of the non-volatile memory are sensed using a set of candidate read voltages to generate sensing data, at 602. The set of candidate read voltages includes a first group of candidate read voltages corresponding to a first read voltage and a second group of candidate read voltages corresponding to a second read voltage. For example the group 106 of storage elements of FIG. 1 may be sensed according to the candidate voltages illustrated in the graphical depiction 200 of FIG. 2.

The sensing data is stored in a memory that is accessible to the controller, at 604. For example, the sensing data may be stored in the memory 152, such as a controller RAM.

Multiple representations of data stored in the group of storage elements are generated based on the sensing data, at 606. Each of the multiple representations of the data emulates results of reading the storage elements using a different combination of candidate reading voltages. For example, the multiple representations of the data may include the emulated readings at various candidate voltages for VA (and a constant value of VE) as illustrated in FIG. 2.

Values of the first read voltage and the second read voltage are selected based on ECC related information from an error correction coding (ECC) decoder, at 608. The ECC related information is responsive to the multiple representations of the data. For example, the ECC related information may correspond to the first ECC related information 142 of FIG. 1.

The sensing data may be stored according to a table having a multi-bit value corresponding to each of the storage elements, each of the multi-bit values corresponding to a distinct threshold voltage region. For example, the table 210 of FIG. 2 illustrates a 6-bit value for each storage element indicating a threshold voltage region for each storage element, such as the value "111101" for the storage element with index 4, indicating a threshold voltage in voltage region extending from $VA-2\Delta R$ to $VA-\Delta R$.

The sensing data may be transferred from the non-volatile memory to the controller a single time. For example, the memory 152 may be a controller random access memory (RAM) as illustrated in FIG. 1. By performing a single sensing at each of the candidate voltages and a single transfer of the sensing data to the controller, an amount of data to be transferred between the non-volatile memory and the controller, and an amount of time to perform read voltage updates, may be reduced as compared to the method 300 of FIG. 3.

Figure 7:
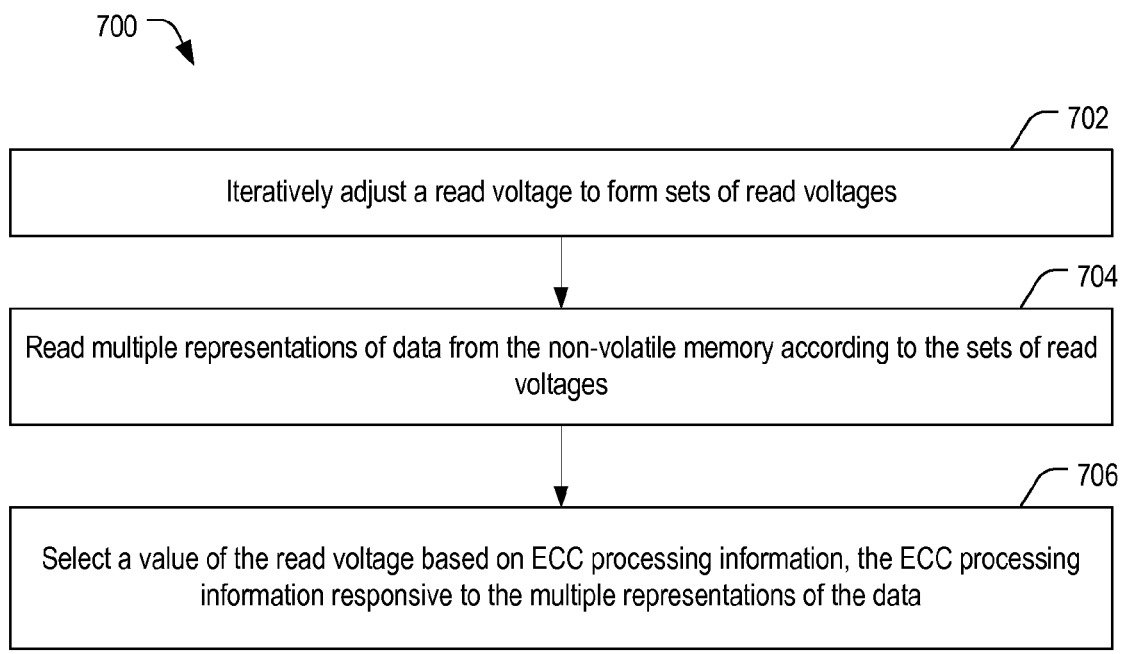
FIG. 7 is a flow chart of another particular embodiment of a method of updating read voltages that may be performed by the data storage device of FIG. 1.

FIG. 7 depicts an embodiment of a method 700 of updating a set of read voltages. The method 700 may be performed in a data storage device including a controller and a non-volatile memory, such as the data storage device 102 of FIG. 1.

The method 700 includes iteratively adjusting a read voltage to form sets of read voltages, at 702. For example, the read voltage update engine 140 may adjust the read voltage VA to have the multiple trial values 191-195 to form the sets 170-172 of read voltages. As another example, in an SLC implementation, a single read voltage VA may be used and each set of read voltages may include a distinct trial value of VA.

Multiple representations of data are read from the non-volatile memory according to the sets of read voltages, at 704. For example, the multiple representations of the data may include the representations 180-182 corresponding to the sets 170-172 of read voltages of FIG. 1. To illustrate, the first representation 180 may correspond to reading the group 106 using the first set 170, and the Nth representation 182 may correspond to reading the group 106 using the Nth set 172 of read voltages.

A value of the read voltage is selected based on ECC processing information, at 706. The ECC processing information is responsive to the multiple representations of the data. The ECC processing information may be acquired without fully decoding, or prior to fully decoding, all of the multiple representations of the data. As an example, the ECC processing information may correspond to a syndrome value (that may be generated by an ECC decoder or may be generated by other components (e.g., dedicated circuitry) other than an ECC decoder). As another example, the ECC processing information may correspond to a length of time of a decoding operation. As another example, the ECC processing information may correspond to a count of bit values that change during a decoding operation. As another example, the ECC processing information may correspond to a similarity of reference data to each of the multiple first representations of the data (e.g., based on counts of differences, or bit errors, between the first representations and the reference data).

Although various components depicted herein are illustrated as block components and described in general terms, such components may include one or more microprocessors, state machines, or other circuits configured to enable the read voltage update engine 140 of FIG. 1 to instruct reading of data from the non-volatile memory using multiple trial values of each read voltage and to select an updated read voltage based on ECC related information. For example, the mapping circuitry may represent physical components, such as hardware controllers, state machines, logic circuits, or other structures, to enable comparisons between ECC related information resulting from reading data using each trial value to select a trial value that corresponds to a lowest estimated or actual error rate as compared to the actual or estimated error rates corresponding to the other trial values.

The read voltage update engine 140 may be implemented using a microprocessor or microcontroller programmed instruct reading of data from the non-volatile memory using multiple trial values of each read voltage and to select an updated read voltage based on ECC related information, such as by comparing ECC related information resulting from reading data using each trial value to select a trial value that corresponds to a lowest estimated or actual error rate as compared to the actual or estimated error rates corresponding to the other trial values. In a particular embodiment, the read voltage update engine 140 includes a processor executing instructions that are stored at the non-volatile memory 104. Alternatively, or in addition, executable instructions that are executed by the processor may be stored at a separate memory location that is not part of the non-volatile memory 104, such as at a read-only memory (ROM) or at the memory 152.

In a particular embodiment, the data storage device 102 of FIG. 1 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of updating read voltages to generate at least a first updated read voltage and a second updated read voltage, the method comprising:
   in a data storage device including a controller and a multi-level cell (MLC) non-volatile memory, performing:
      reading multiple first representations of data from the MLC non-volatile memory using multiple first trial sets of read voltages, the first trial sets of read voltages generated by iteratively adjusting a first read voltage without adjusting a second read voltage, wherein at least one first read voltage of the first read voltages is configured for reading data corresponding to states of memory cells of the MLC non-volatile memory; and
      storing updated read voltages that include the first updated read voltage and the second updated read voltage, wherein the first updated read voltage includes a first value of the first read voltage, the first value selected based on first error correction coding (ECC) related information and based on the multiple first representations of the data, wherein the second updated read voltage includes a second value of the second read voltage that is selected based on iteratively adjusting the second read voltage, without adjusting the first read voltage, to generate multiple second trial sets of read voltages used to read second representations of data from the MLC non-volatile memory, wherein each of the second trial sets of read voltages includes the first value and an iteratively adjusted version of the second read voltage.

2. The method of claim 1, wherein iteratively adjusting the first read voltage includes:
generating a set of first values of the first read voltage according to a first step size; and
after identifying one of the first values of the set of first values based on a portion of the first ECC related information, generating a second set of first values of the first read voltage according to a second step size that is smaller than the first step size.

3. The method of claim 1, wherein one of a plurality of first ECC operations is performed on each of the multiple first representations, and wherein the first value is selected after performing the plurality of first ECC operations.

4. The method of claim 1, wherein the first ECC related information corresponds to at least one of a syndrome value or a count of errors detected by an ECC decoder without adjusting the first read voltage.

5. The method of claim 1, wherein the first ECC related information corresponds to a length of time of a decoding operation.

6. The method of claim 1, wherein the first ECC related information corresponds to at least one of a count of bit values that change during a decoding operation or a similarity of reference data to each of the multiple first representations.

7. The method of claim 1, wherein the second value is selected based on ECC related operations associated with the second representations.

8. The method of claim 1, wherein:
reading the MLC non-volatile memory using the multiple first trial sets of read voltages generates the multiple first representations, and
reading the MLC non-volatile memory using the multiple second trial sets of read voltages generates the second representations.

9. A method of generating a set of updated read voltages, the method comprising:
in a data storage device including a controller and a multi-level cell (MLC) non-volatile memory, performing:
reading multiple representations of data from the MLC non-volatile memory using a plurality of read voltages to generate at least two sets of sensing data, the plurality of read voltages generated by iteratively adjusting a first read voltage without adjusting at least one additional read voltage, wherein at least one read voltage of the plurality of read voltages is configured for reading data corresponding to states of memory cells of the MLC non-volatile memory;
after reading the multiple representations, performing a bit-wise logical exclusive-OR operation on the at least two sets of sensing data;
performing a plurality of error correction coding (ECC) related operations based on the multiple representations, wherein an ECC related operation of the plurality of ECC related operations is performed for each of the iteratively adjusted read voltages; and
after performing the plurality of ECC related operations, selecting the set of updated read voltages, wherein the set of updated read voltages includes a first updated read voltage and a second updated read voltage generated based on the first updated read voltage, the first updated read voltage associated with a value of the first read voltage based on the plurality of ECC related operations.

10. The method of claim 9, further comprising performing a bit-wise logical inverse operation on a result of the exclusive-OR operation.

11. The method of claim 9, wherein the plurality of ECC related operations are used to generate ECC related information that corresponds to a count of bit values that change during a decoding operation.

12. The method of claim 9, wherein the second updated read voltage includes a second value of a second read voltage, the second value selected based on iteratively adjusting the second read voltage without adjusting the first read voltage to generate multiple second read voltages and based on ECC related operations associated with second representations.

13. The method of claim 12, wherein:
the plurality of read voltages includes multiple first trial sets of read voltages,
reading the MLC non-volatile memory using the multiple first trial sets of read voltages generates the multiple representations, and
the multiple second read voltages include multiple second trial sets of read voltages, each of the multiple second trial sets of read voltages including an iteratively adjusted version of the second read voltage and including the value, and
reading the MLC non-volatile memory using the multiple second trial sets of read voltages generates multiple second representations of the data.

14. A data storage device comprising:
a controller; and
a multi-level cell (MLC) non-volatile memory coupled to the controller, wherein the controller is configured to:
read multiple first representations of data from the MLC non-volatile memory using multiple first trial sets of read voltages, the first trial sets generated by iteratively adjusting a first read voltage without adjusting a second read voltage, wherein at least one first read voltage of the first read voltages is configured for reading data corresponding to states of memory cells of the MLC non-volatile memory,
read multiple second representations of data from the MLC non-volatile memory using multiple second trial sets of read voltages, the second trial sets generated by iteratively adjusting the second read voltage, without adjusting the first read voltage, to generate second reading voltages, wherein each of the multiple second trial sets of read voltages includes a first value of the first read voltage and an iteratively adjusted version of the second read voltage, and
store a set of updated read voltages that includes a first updated read voltage and a second updated read voltage, the first updated read voltage including the first value of the first read voltage, the second updated read voltage including a second value of the second read voltage, the first value selected based on first error correction coding (ECC) related information and based on the multiple first representations of the data, the second value based on ECC related operations associated with the second representations.

15. The data storage device of claim 14, wherein the controller is further configured to:
   determine whether a convergence condition has been satisfied by comparing the first ECC related information to second ECC related information, the second ECC related information resulting from the second representations; and
   in response to determining that the convergence condition has not been satisfied, determine second updated read voltages based on third ECC related information based on third representations of the data according to third read voltages.

16. The data storage device of claim 14, wherein the controller is further configured to iteratively adjust the first read voltage by generating a set of first values of the first read voltage according to a first step size and, after identifying one of the first values of the set of first values based on a portion of the first ECC related information, generate a second set of first values of the first read voltage according to a second step size that is smaller than the first step size.

17. The data storage device of claim 14, wherein the controller is further configured to generate the second updated read voltage based on the first updated read voltage and to store the set of updated read voltages without generating updated first read voltages using the first updated read voltage and the second updated read voltage.

18. The data storage device of claim 14, wherein the first ECC related information corresponds to a syndrome value generated by an ECC decoder.

19. The data storage device of claim 14, wherein the first ECC related information corresponds to a count of errors detected by an ECC decoder or a length of time of a decoding operation.

20. The data storage device of claim 14, wherein the first ECC related information corresponds to a count of bit values that change during a decoding operation.

21. The data storage device of claim 14, wherein the first ECC related information corresponds to a similarity of reference data to each of the multiple first representations.

22. The data storage device of claim 14, wherein the second value is based on the second reading voltages.

23. The data storage device of claim 14, wherein the controller is further configured to read the multiple first representations to generate at least two sets of sensing data and, after reading the multiple first representations, to perform one or more bit-wise logical operations based on the at least two sets of sensing data.

24. The data storage device of claim 23, wherein the one or more bit-wise logical operations include:
   an exclusive-OR operation performed on the at least two sets of sensing data; and
   a logical inverse operation performed on a result of the exclusive-OR operation.

* * * * *